(12) United States Patent
Villamizar et al.

(10) Patent No.: US 11,797,264 B2
(45) Date of Patent: Oct. 24, 2023

(54) DYNAMIC ACOUSTIC CONTROL SYSTEMS AND METHODS

(71) Applicant: ALPS ALPINE CO., LTD., Tokyo (JP)

(72) Inventors: Francesto Villamizar, Novi, MI (US); Ryosuke Shibuya, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 97 days.

(21) Appl. No.: 17/561,269

(22) Filed: Dec. 23, 2021

(65) Prior Publication Data

US 2023/0205481 A1 Jun. 29, 2023

(51) Int. Cl.
*G06F 3/16* (2006.01)
*H04R 3/12* (2006.01)
*H04S 7/00* (2006.01)

(52) U.S. Cl.
CPC .............. *G06F 3/165* (2013.01); *H04R 3/12* (2013.01); *H04S 7/301* (2013.01); *H04R 2499/13* (2013.01); *H04S 2400/13* (2013.01)

(58) Field of Classification Search
None
See application file for complete search history.

(56) References Cited

U.S. PATENT DOCUMENTS

| | | |
|---|---|---|
| 8,126,159 B2 | 2/2012 | Goose et al. |
| 9,503,819 B2 | 11/2016 | Brockmole |
| 10,499,177 B2 | 12/2019 | Choi et al. |
| 2017/0257722 A1* | 9/2017 | Kerdranvat ............. H04S 3/002 |

FOREIGN PATENT DOCUMENTS

| | | |
|---|---|---|
| EP | 3232688 A1 | 10/2017 |
| GB | 2546632 A | 7/2017 |
| WO | WO 2020/141489 A1 | 7/2020 |

OTHER PUBLICATIONS

Partial European Search Report for EP Application No. 22 21 1597 dated May 2, 2023 in 13 pages.

* cited by examiner

*Primary Examiner* — Paul W Huber
(74) *Attorney, Agent, or Firm* — Knobbe, Martens, Olson & Bear, LLP

(57) ABSTRACT

An acoustic system can include an acoustic processor that is configured to analyze and output acoustic signals to each of first and second loudspeakers corresponding to each of first and second acoustic zones of a shared acoustic space. The system can determine a first measure of loudness associated with a first acoustic signal. The system can be configured to output the first acoustic signal as sound on the first loudspeaker in the first acoustic zone. The system can determine a second measure of loudness associated with a second acoustic signal. The system can be configured to output the second acoustic signal as sound on the second loudspeaker in the second acoustic zone. The system can also modify the second acoustic signal based on the first acoustic signal.

19 Claims, 5 Drawing Sheets

DYNAMIC ACOUSTIC CONTROL SYSTEMS AND METHODS

BACKGROUND

Field

This disclosure relates generally to acoustic systems and particularly to multizone acoustic control systems and methods.

Description of Related Art

Single-zone acoustic systems can be configured to output sound into a single acoustic zone. Multizone acoustic control systems can allow a user to independently control aspects of different acoustic zones, including zones located in a shared acoustic space. Some features with respect to multizone acoustic control systems are lacking, and this application provides solutions for gaps in the current art.

SUMMARY

Example embodiments described herein have innovative features, no single one of which is indispensable or solely responsible for their desirable attributes. Without limiting the scope of the claims, some of the advantageous features will now be summarized.

In some embodiments, an acoustic system includes an acoustic processor that is configured to analyze and output acoustic signals to each of the first and second loudspeakers corresponding to each of the first and second zones of the shared acoustic space. The system also includes a non-transitory memory that includes instructions executable by the acoustic processor. The instructions, when executed by the acoustic processor, cause the system to perform a number of actions. For example, the processor may determine a first measure of loudness associated with a first acoustic signal. The acoustic processor can be configured to output the first acoustic signal as sound on the first loudspeaker. The processor can determine a second measure of loudness associated with a second acoustic signal. The acoustic processor can be configured to output the second acoustic signal as sound on the second loudspeaker. The processor can also modify the second acoustic signal based on the first acoustic signal.

In some embodiments, a method can include receiving a first acoustic zone source signal that is configured to be reproduced as a first acoustic zone source signal on a first subset of a plurality of loudspeakers located in a first acoustic zone of the shared acoustic space. The method can include determining a measure of first acoustic zone loudness. The measure of first acoustic zone loudness can be based on at least the first acoustic zone source signal during a first loudness sampling period. The method can include generating a loudness filter that includes a maximum loudness level. The maximum loudness level can be based at least in part on the measure of first acoustic zone loudness. The method may further include receiving a second acoustic zone source signal that is configured to be reproduced as a second acoustic zone source signal on a second subset of the plurality of loudspeakers located in a second acoustic zone of the shared acoustic space. The method can include applying the loudness filter to the second acoustic zone source signal to generate filtered sound signals. A loudness level of the filtered sound signals may be limited by the maximum loudness level. The method can include reproducing the filtered sound signals on the second subset of the plurality of loudspeakers.

BRIEF DESCRIPTION OF THE DRAWINGS

The following drawings and the associated descriptions are provided to illustrate embodiments of the present disclosure and do not limit the scope of the claims.

Figure 1:
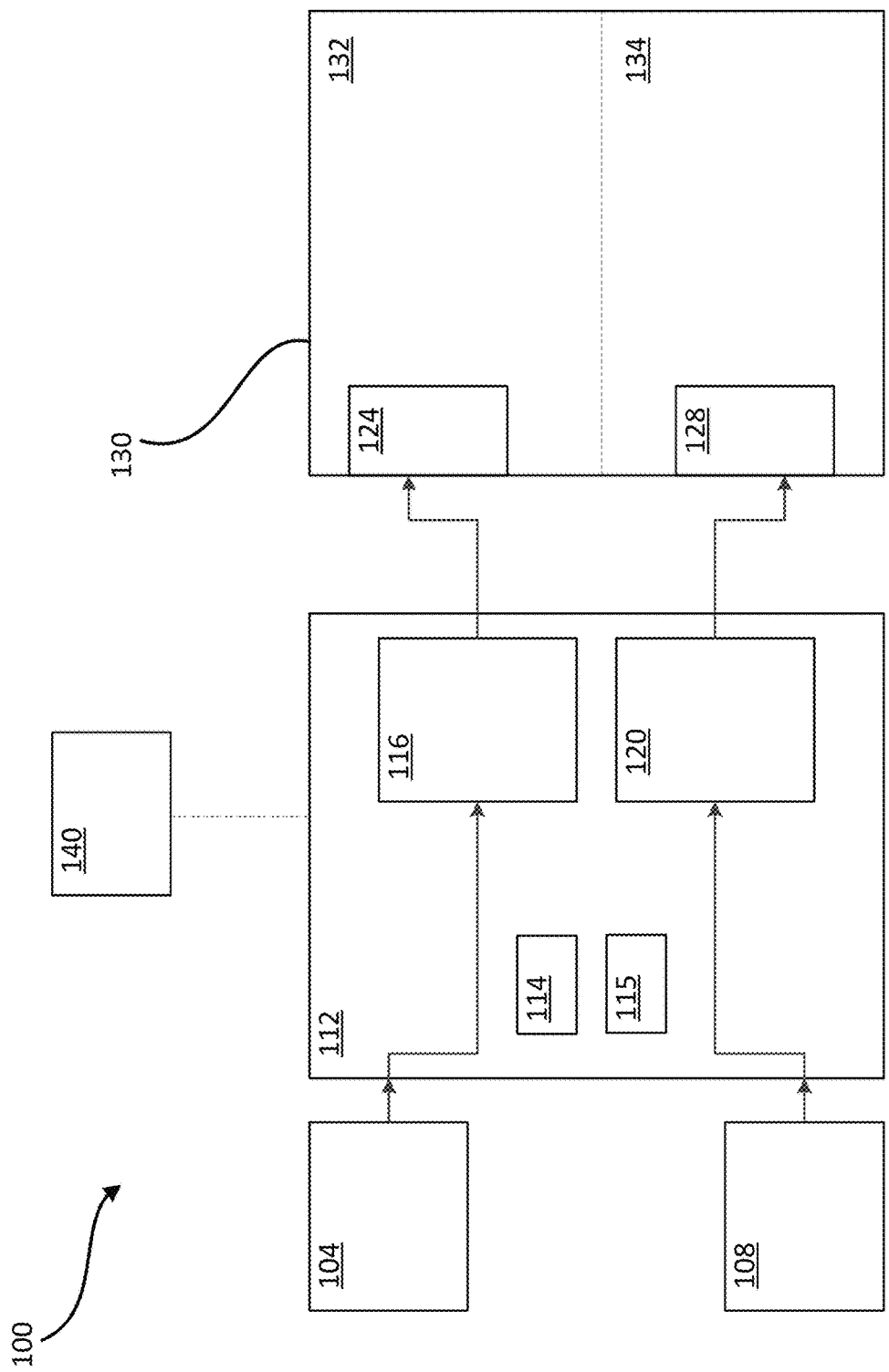
FIG. 1 shows a schematic of an example multizone acoustic system that includes a multizone acoustic processor.

These and other features will now be described with reference to the drawings summarized above. The drawings and the associated descriptions are provided to illustrate embodiments and not to limit the scope of any claim. Throughout the drawings, reference numbers may be reused to indicate correspondence between referenced elements.

DETAILED DESCRIPTION

Acoustic systems generally control acoustic signals for single acoustic zones. These systems allow a user to adjust various characteristics (e.g., master volume, bass, treble, etc.). A user may select the desired or target characteristic and adjust an acoustic processor setting that increases or decreases, for example, the gain on one or more speakers in the acoustic zone. A high-pass and/or low-pass filter may be applied to the gain, which may modify high frequency output (e.g., bass) differently from low frequency output (e.g., treble).

Multizone acoustic systems can allow a user control over two or more acoustic zones, often independently of each other. A user may, for example, adjust additional characteristics of the audio output, such as balance, fade, and other characteristics among the two or more acoustic zones. Balance and fade functionality can improve a user experience by providing more granular control of audio output within each zone. Balance and fade controls within a multizone acoustic systems can re-position the audio image within the listening space to accommodate particular user preferences. Additionally or alternatively, independent control can reduce the likelihood that the audio disturbs listeners within corresponding zones of the multizone shared space.

Re-positioning the audio can include tailoring the acoustic sound field according to individual preference while maintaining overall sound quality for other users or listeners. This may involve providing different gains to different loudspeakers based on the preferences so that, for example, an even timbre and/or proper acoustic summation is maintained throughout the listening environment.

Re-locating the audio can include isolating or focusing the audio to certain target areas of the multizone shared acoustic space to avoid disturbing certain listeners, for example in the nontarget zone(s). The loudspeakers located in or near the nontarget acoustic zones may have their output volume reduced or completely muted to lessen the acoustic output experienced by listeners in those zones. It may additionally or alternatively be desirable to filter the audio by frequency, such as reducing low-frequency content due to the nature of its omni-directional propagation.

In various types of audio systems, a user may adjust the left/right balance and front/rear fade from a default or detent setting within a certain range. Progressively changing the balance control or input progressively can move the audio output to the left or right of the listening environment by adjusting the signal processing of one or more loudspeakers relative to one another. Fade control may operate in a similar fashion to progressively move the audio output toward the front or rear of the listening environment.

Disclosed herein are multizone acoustic control systems that build on the concepts described above by providing further improved user experience. The systems described herein can automatically modify and/or filter sound within a first zone based at least in part on sound from another zone within a multizone shared acoustic space. Such spaces may be within a vehicle, a home, an auditorium, an enclosed outdoor space, and/or any other multizone shared acoustic space. For example, a vehicle may be divided into at least two acoustic zones (e.g., left, right, back, front), for which the audio may be independently controlled by one or more users. Within each zone, noise cancellation, sound attenuation, and other parameters may be controlled to improve sound quality and reduce interference among the zones. Each acoustic zone may be associated with a corresponding volume level selection interface that can allow a user to raise or lower a target volume.

In some embodiments, acoustic zone control may be independently controlled by different users. This can in some cases result in the sound in one acoustic zone overpowering another acoustic zone, which may result in an imbalanced listening experience. For example, a first acoustic zone may play music that is too loud relative to a second acoustic zone, thus causing the volume in the first acoustic zone to interfere with the sound quality in the second acoustic zone. Systems described herein may determine an average loudness of a first zone (e.g., a zone used by the vehicle driver). The system can then automatically set a limit of how loud one or more other zones can play their content based at least in part on how loud the first zone is playing its content.

In some embodiments, the system may determine an average loudness of both the first and second acoustic zones. The system may determine a maximum loudness based on the average loudness for the first and second acoustic zones. For example, the system may determine a difference between the average loudness of each zone. Based on this difference, the system may identify a maximum loudness and/or a maximum loudness difference for one or both of the first and second acoustic zones. In certain embodiments, the system generates a maximum loudness for the second acoustic zone based on the average loudness of the first acoustic zone plus an offset. Depending on the requirements of a particular shared acoustic space, the offset can be a positive value, a negative value, and/or zero. In some embodiments, the offset is a static value. In other embodiments, the offset is a dynamic value that can depend on factors such as, for example, the level of loudness in one or more acoustic zones, whether a phone call is taking place in one or more of the acoustic zones, whether one or more acoustic zones have priority over other acoustic zones, whether there is substantial separation between two or more of the acoustic zones, the source of the acoustic signal in one or more of the acoustic zones, and/or other factors. In cases where the shared acoustic space is a vehicle, the offset can additionally or alternatively depend on factors such as, for example, the speed of the vehicle, the size of the vehicle, the location of the vehicle, and so forth.

In some embodiments, the system can identify one or more acoustic zones as controlling zone(s). Additionally or alternatively, the system can identify one or more acoustic zones as controlled zone(s). For conciseness, the following discussion will refer to a controlling zone and a controlled zone, although there may be a plurality of either kind of zone or both kinds of zones. The controlling zone may influence the sound that is output to the controlled zone. For example, the controlling zone may have an associated volume level selection that is configured to output sounds that are quieter than sounds output from the controlled zone. In this example, the controlled zone may be prevented from outputting sounds that are louder (e.g., within an offset) than sounds output by the controlling zone. This kind of controlling-controlled relationship can avoid unpleasant sound experiences by the occupant(s) in the shared acoustic space.

In some embodiments, the acoustic zone that is the controlling zone and/or the acoustic zone that is the controlled zone may change over time based on one or more factors. For example, the controlling zone may change if the system determines that the controlling zone is configured to output sounds louder (e.g., within an offset) than sounds output by the controlled zone. In such cases, a controlling zone may become a controlled zone, for example, if a user increases a volume level selection associated with the controlling zone that would cause the controlling zone to suddenly output sounds louder than the controlled zone. Thus, the controlling zone may switch to the controlled zone. Additionally or alternatively, a controlled zone may become a controlling zone if a user reduces the volume level selection within the controlled zone.

In some embodiments, a default controlling zone may be selected by the system based on a position within the shared acoustic space associated with an acoustic zone. For example, an acoustic zone corresponding to the driver of a vehicle may be selected as the default controlling zone. By way of another example, a master bedroom may be considered a default controlling zone if other rooms are considered as part of the shared acoustic space.

The average loudness of one zone or of a plurality of zones can be calculated over one or more loudness sampling periods. A loudness sampling period may be on the order of microseconds, milliseconds, seconds, or minutes. For example, a loudness sampling period may be about 1 microsecond, about 2 microseconds, about 5 microseconds, about 10 microseconds, about 15 microseconds, about 25 microseconds, about 35 microseconds, about 50 microseconds, about 65 microseconds, about 75 microseconds, about 85 microseconds, about 100 microseconds, about 250 microseconds, about 350 microseconds, about 500 microseconds, about 750 microseconds, about 1000 microseconds, about 1250 microseconds, about 1500 microseconds, any value therebetween, or fall within a range having endpoints of any of the foregoing values. In some embodiments, the loudness sampling period is longer, such as about 1 ms, about 10 ms, about 50 ms, about 100 ms, about 500 ms, about 1 s, about 2 s, about 5 s, about 10 s, any value therebetween, or fall within a range having endpoints of any of the foregoing values. As used herein, the term "about" in reference to a value means that the actual value is not substantially different from the recited value. For example, in the context of loudness sampling periods, the actual value can be within about 10% of the recited value. The system may continuously and/or regularly recalculate the average loudness and readjust the assigned loudness in the other zones. The recalculation may be at regular or irregular intervals over the course of a resampling period. The resampling period may be on the order of seconds, minutes, hours, or days.

Reference will now be made to the Figures. Unless otherwise specified, terms used herein will have their ordinary and customary meaning.

FIG. 1 shows a schematic of an example multizone acoustic system 100 that includes a multizone acoustic processor 112 that is configured to receive acoustic signals from each of a first signal source 104 and a second signal source 108. The multizone acoustic processor 112 may include a memory 114, a processor 115, and one or more amplifiers (e.g., first signal power amplifier 116, second signal power amplifier 120). The multizone acoustic processor 112 may analyze and/or modify (e.g., provide gain, translate) the corresponding signals to reproduce signals on each of first and second loudspeakers 124, 128 corresponding to each of first and second zones 132, 134 of a shared acoustic space 130. Each of the first and second acoustic zones 132, 134 may correspond to physical areas or regions each configured to be occupied respective occupants. Each of the first and second acoustic zones 132, 134 may be separate regions and, in some embodiments, may be separated by physical barriers and/or by a particular distance. The multizone acoustic processor 112 can include one or more special purpose processors, such as DSPs, and/or general-purpose microprocessors, such as CPUs.

The signal sources 104, 108 can correspond to any signal source that may provide an aural form of media. For example, the signal sources 104, 108 may correspond to a radio receiver, a microphone, a media player (e.g., DVD player, gaming console, MP4 player, etc.), a computer controller, or any other media source. Each of the first signal source 104 and the second signal source 108 can transmit respective acoustic signals to the multizone acoustic processor 112, such as via a wired connection. Wireless connections are also possible in some embodiments. The acoustic signals may be analog or digital signals. The signals may include one or more of a loudness attribute, a timbre attribute, a pitch attribute, and/or any other attribute. The multizone acoustic processor 112 can determine a loudness level of one or more of the source signals.

In some embodiments the multizone acoustic processor 112 includes a user interface 140 that can allow a user to modify one or more of the source signals from the signal sources 104, 108. The multizone acoustic processor 112 may be operatively coupled to the multizone acoustic processor 112 in some embodiments. The multizone acoustic processor 112 can receive one or more volume levels from one or more volume level selection interfaces of the user interface 140. For example, in some embodiments, an occupant of the first acoustic zone 132 may be able to adjust a first volume level selection associated with the first acoustic zone 132 via a first volume level selection interface, and an occupant of the second acoustic zone 134 may be able to adjust a second volume level selection associated with the second acoustic zone 134 via a second volume level selection interface. Other arrangements are possible.

The user interface 140 can include a display to show various information about the multizone acoustic processor 112. The display may show graphical images and text using any display technology including, but not limited to OLED, LCD, or e-ink. In some embodiments, the user interface may include an alphanumeric pad, knob, dial, or touch interface that lets a user enter information or interact with the multizone acoustic processor 112 to modify the settings of the multizone acoustic system 100. The alphanumeric pad may include a multitude of keys with numerical, alphabetical, and symbol characters. In different embodiments, the keys of the alphanumeric pad may be capacitive or mechanical. The user interface 140 may include a touchscreen display that produces output and accepts input enabling a two-way interaction between the user and the multizone acoustic processor 112. The touchscreen display may be any input surface that shows graphic images and text and also registers the position of touches on the input surface. The touchscreen display may accept input via capacitive touch, resistive touch, or other touch technology. The input surface of the touchscreen display can register the position of touches on the surface. In some examples, the touchscreen display can register multiple touches at once. In some embodiments, the keypad may be a display of a keypad. For example, an alphanumeric pad comprising user-selectable letters, numbers, and symbols may be displayed on the touchscreen display. In some examples, the touchscreen may present one or more user-interface screens to a user enabling the user to modify one or more attributes of a received signal. In some examples, a user-interface screen may comprise one or more physical control elements (e.g., knobs, dials, levers, buttons, etc.). Additionally or alternatively, the user interface 140 may include one or more user input elements displayed on the screen that enable a user to interact with the multizone acoustic processor 112.

The first signal power amplifier 116 and the second signal power amplifier 120 can receive the modified or unmodified signals from the respective signal sources 104, 108. The signal power amplifiers 116, 118 can impart gain to the respective received signals based on a target volume level, such as a volume level selected by a user. The target volume level can specify the amount of gain provided by each signal power amplifiers 116, 118. There may be a target volume level associated with each signal power amplifiers 116, 118. The one or more target volume levels may be selected by a user via the user interface 140.

The signal power amplifiers 116, 118 output the respective gained signal to corresponding subsets 124, 128 of speakers. Each subset 124, 128 of speakers may be from a plurality of speakers and/or corresponding plurality of speakers. In some embodiments, each acoustic zone 132, 134 includes corresponding pluralities of speakers. The subsets 124, 128 of speakers can output sound based on the gained signal received by each. Thus, the signal power amplifiers 116, 118 can be configured to reproduce sound signals on the corresponding subsets 124, 128 of speakers. The outputted sound from each of the subsets 124, 128 of speakers can have a corresponding volume or loudness. Loudness or volume may be used interchangeably and may generally refer to the perceived loudness by a user. Loudness/volume can be measured in decibels (dB), decibels relative to full scale (dBFS), or some other measure. To avoid confusion, loudness and volume generally refer to an attribute of the output sound, whereas "loudness level" or "measure of loudness" generally refers to an attribute of the source signal (modified or unmodified), and "volume level" generally refers to an attribute (e.g., amount of gain) applied to the source signal, for example, by a user (e.g., via a volume knob) to modify the source signal.

The multizone acoustic processor 112 can generate a loudness filter that creates a cap on the maximum loudness level of a signal (and/or, in some embodiments, portion of the signal) that can be submitted to the corresponding first speaker subset 124 or second speaker subset 128. In some embodiments, the multizone acoustic processor 112 generates a loudness filter on one or more of the signals output by the signal power amplifiers 116, 118.

The loudness filter can be determined in one or more ways. In some embodiments, the loudness filter is determined by determining a measure of loudness (e.g., loudness level) that is to be output by a corresponding subset 124, 128 of speakers. The measure of loudness may be based at least on a source signal (e.g., one received by the multizone acoustic processor 112 and/or the first speaker subset 124) and/or on a volume level (e.g., one received by a user via the user interface 140). The measure of loudness may correspond to an average level of loudness in the signal (e.g., after modified in response to user selection of a volume level) before it is reproduced on the corresponding subset 124, 128 of speakers. The loudness level may be determined over a loudness sampling period, such as one described herein. The loudness sampling period may repeat at multiple times over the course of seconds, minutes, hours, or days. In some embodiments, the sampling period may be determined at a regular sampling frequency (e.g., at regular intervals). In some embodiments, the multizone acoustic system 100 may determine an average loudness level corresponding to two or more subsets 124, 128 of speakers. For example, the multizone acoustic processor 112 may determine a first loudness level corresponding to the first speaker subset 124, and a second loudness level corresponding to the second speaker subset 128.

The multizone acoustic system 100 may determine the loudness filter based on one or more loudness levels. In some embodiments, the multizone acoustic processor 112 determines the loudness filter based on a single loudness level (e.g., of the first speaker subset 124). For example, the loudness filter may set the maximum loudness that can be output from any speaker subset.

In some embodiments, the multizone acoustic system 100 selects an acoustic zone to be a controlled acoustic zone. The selection of the controlled acoustic zone may be based at least in part on measures of loudness associated with the first acoustic zone 132 and the second acoustic zone 134. For example, the multizone acoustic system 100 may determine that the measure of loudness configured to be output by the first speaker subset 124 is greater than the measure of loudness configured to be output by the second speaker subset 128. Based on the fact that the first speaker subset 124 is configured to output louder sounds than the second speaker subset 128, the system can generate a loudness filter that is configured to cap a loudness level of sound signals configured to be reproduced on the first speaker subset 124. The loudness level may be limited by a maximum loudness level and/or a volume level selection of the controlled acoustic zone. For example, a user may increase a volume selection associated with the first speaker subset 124, but since the first acoustic zone 132 is the controlled zone (in this example), the first speaker subset 124 may be prevented from outputting sounds louder than a maximum loudness (e.g., associated with the maximum loudness level of the signal received by the first speaker subset 124).

If a user increases a volume level selection associated with a controlled zone, the system may cap a loudness level of one or both of the louder portions of the signal and/or of the softer portion of the signal. To avoid confusion, "softer" and "louder" portions of a signal refers to a relative measure of loudness associated with the corresponding portions of the signal received by a subset of loudspeakers. For example, in some embodiments an increase in the volume level associated with the controlled zone may cause only the louder portions of the signal to be capped while the softer portions of the signal may become louder. In this way, a dynamic volume range of the signal may be reduced since the louder portions of the signal do not become louder but the softer portions do become louder.

In some embodiments, in response to an increase in the volume level selection associated with a controlled zone, the multizone acoustic system 100 may cap both the louder and softer portions of the signal. For example, the maximum loudness level may be applied to the loudest portion of the signal. This may prevent any portion of the signal from being amplified, which may result in maintaining the original dynamic range of the signal. Thus, in such embodiments, a maximum loudness level associated with the quieter parts may be based at least in part on a maximum loudness level associated with the loudest portion of the signal.

In some embodiments, the multizone acoustic processor 112 determines the loudness filter based on two or more loudness levels. For example, the multizone acoustic processor 112 may determine a difference between the two average loudness levels and determine a maximum loudness level based thereon. Additionally or alternatively, the multizone acoustic processor 112 may determine a difference between maximum measures of loudness associated with each of the two signals and determine a maximum loudness level based thereon.

In some embodiments, the maximum loudness level is determined by a spatial region associated with a default controlling zone. For example, the multizone acoustic system 100 may select the controlling zone based on its spatial region within the shared acoustic space. The default controlling zone may correspond to the driver side of a vehicle, a front portion of the shared acoustic space, a master bedroom of a home, or some other spatial region. In some embodiments, the controlling zone may be selected by a user (e.g., via the user interface 140). As noted above, the default controlling zone may change based on or more factors (e.g., based on a change in volume selection and/or on a change in a measure of loudness associated with another acoustic zone, such as a controlled zone).

The multizone acoustic processor 112 can apply the loudness filter to one or more of the subsets 124, 128 of speakers. For example, the loudness may be determined based on a signal sent to the first speaker subset 124, and the loudness filter may then be applied to the signal sent to the second speaker subset 128. Application of the loudness filter by the multizone acoustic processor 112 can generate filtered sound signals to be output by the corresponding speaker subset. The loudness level of the sound signal may be limited by the maximum loudness level of the signal and/or by the corresponding volume level (e.g., set by the user). The multizone acoustic system 100 can cause the corresponding subsets 124, 128 of speakers to reproduce the filtered sound signals. In this way, a user experience can be enhanced. The multizone acoustic system 100 can reduce the likelihood that sound within the first acoustic zone 132 does not overpower sound from the second acoustic zone 134 or vice versa.

Although two signal sources 104, 108, two signal power amplifiers 116, 118, two subsets 124, 128 of speakers, and two acoustic zones 132, 134 are shown, the multizone acoustic system 100 can include three or more of any of these elements.

In some embodiments, the loudness filter applied by the multizone acoustic processor 112 can be layered with other filters or other modifications to the sound signal. For example, the multizone acoustic processor 112 may modify a sound profile, apply noise cancellation effects, and/or apply filters to account for a range of preferences and situations to one or more of the signals transmitted to the subsets 124, 128 of speakers. Examples of other filters that can be applied include those disclosed in U.S. Patent Application Publication No. 2015/0193196. Such sound profile adjustments or filters can result in modified frequency and/or intensity of the modified signal relative to the source signal. In some examples, the loudness filter can be based on one or more attributes (e.g., pitch, timbre, loudness, etc.) of the signal transmitted to one or more of the subsets 124, 128 of speakers.

Figure 2:
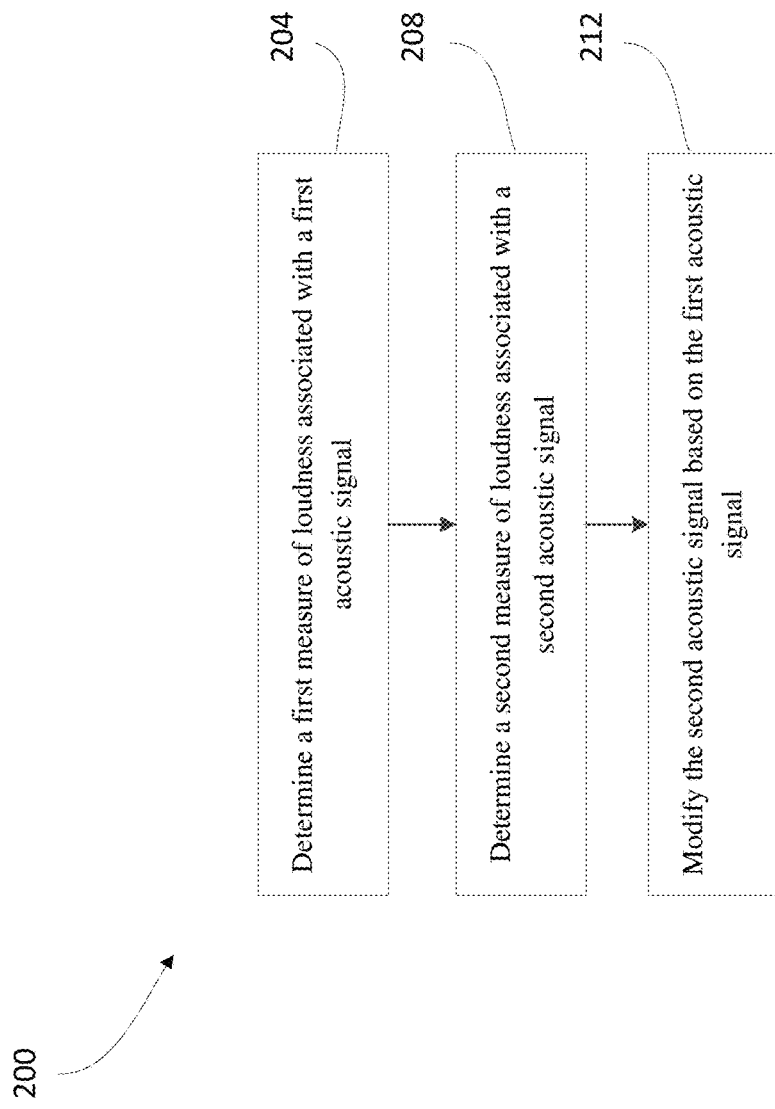
FIG. 2 shows an example method that may be performed by a multizone acoustic system, according to one embodiment.

FIG. 2 shows an example method 200 that may be performed by a multizone acoustic system (e.g., the multizone acoustic system 100 described herein), according to one embodiment. Additionally or alternatively, the method 200 may be performed by a multizone acoustic processor (e.g., the multizone acoustic processor 112 described herein, which could be referred as the "system" below). The method 200 may include at box 204 determining a first measure of loudness associated with a first acoustic signal. At box 208, the system may determine a second measure of loudness associated with a second acoustic signal. The first and/or second acoustic signals may be configured to be sent to respective one or more loudspeakers for reproducing sound. In some embodiments, the system determines that the first measure of loudness is greater than the second measure of loudness. At box 212 the system modifies the second acoustic signal based on the first acoustic signal. The modification of the second acoustic signal may be further based on the determination that the first measure of loudness is greater than the second measure of loudness.

In some embodiments, the method 200 includes receiving the first acoustic signal and receiving selection of a first acoustic zone volume level via a first volume level selection interface. The first acoustic zone volume level may be configured to modify a volume level within the first zone. The first acoustic zone volume level may be received, for example, from a user via a user interface. The system may determine the first measure of loudness based on at least the first acoustic signal and the first acoustic zone volume level. The first measure of loudness may be determined during a loudness sampling period, such as described above. The system may generate a loudness filter that includes a maximum loudness level. The loudness filter may be based at least in part on the first measure of loudness.

In some embodiments, the method 200 includes receiving a second acoustic signal and receiving selection of a second acoustic zone volume level (e.g., via a second volume level selection interface of the user interface). The system may determine the second measure of loudness based on at least the second acoustic signal and the second acoustic zone volume level during the loudness sampling period. The maximum loudness level may be based at least on the second measure of loudness (e.g., equal to the second measure of loudness, a multiple thereof, another function thereof, etc.). In some embodiments, the maximum loudness level comprises a difference between the second measure of loudness and the first measure of loudness.

The system may modify the second acoustic signal based on the first acoustic signal. This may occur by applying the loudness filter to the second acoustic signal to generate filtered sound signals. A loudness level of the filtered sound signals may be limited by at least one of the maximum loudness level and/or the second acoustic zone volume level selection. For example, the loudness level of the filtered sound signals is limited by the maximum loudness level. The method 200 may include outputting the filtered sound signals on the second subset of the plurality of loudspeakers.

Figure 3:
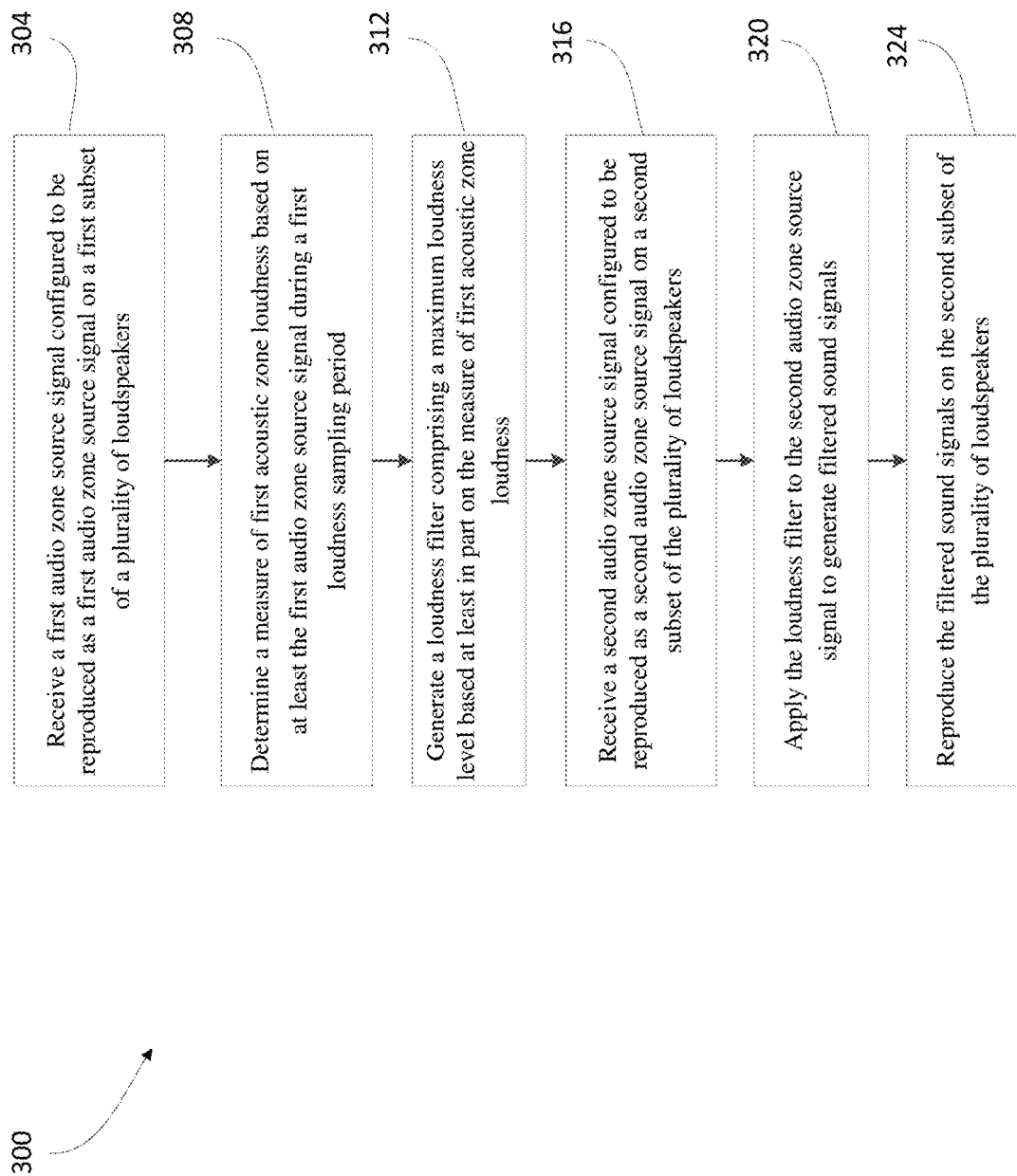
FIG. 3 shows another example method that may be performed by a multizone acoustic system, according to one embodiment.

FIG. 3 shows another example method 300 that may be performed by a multizone acoustic system (e.g., the multizone acoustic system 100 described herein), according to one embodiment. At box 304, the system may receive a first acoustic zone source signal configured to be reproduced as a first acoustic zone source signal on a first subset of a plurality of loudspeakers. At box 308, the system can determine a measure of first acoustic zone loudness that is based on at least the first acoustic zone source signal during a first loudness sampling period, such as one disclosed herein. At box 312 the system may generate a loudness filter that includes a maximum loudness level based at least in part on the measure of first acoustic zone loudness. At box 316, the system receives a second acoustic zone source signal that is configured to be reproduced as a second acoustic zone source signal on a second subset of the plurality of loudspeakers. At box 320, the system applies the loudness filter to the second acoustic zone source signal to generate filtered sound signals, which the system reproduces on the second subset of the plurality of loudspeakers at box 324.

Figure 4:
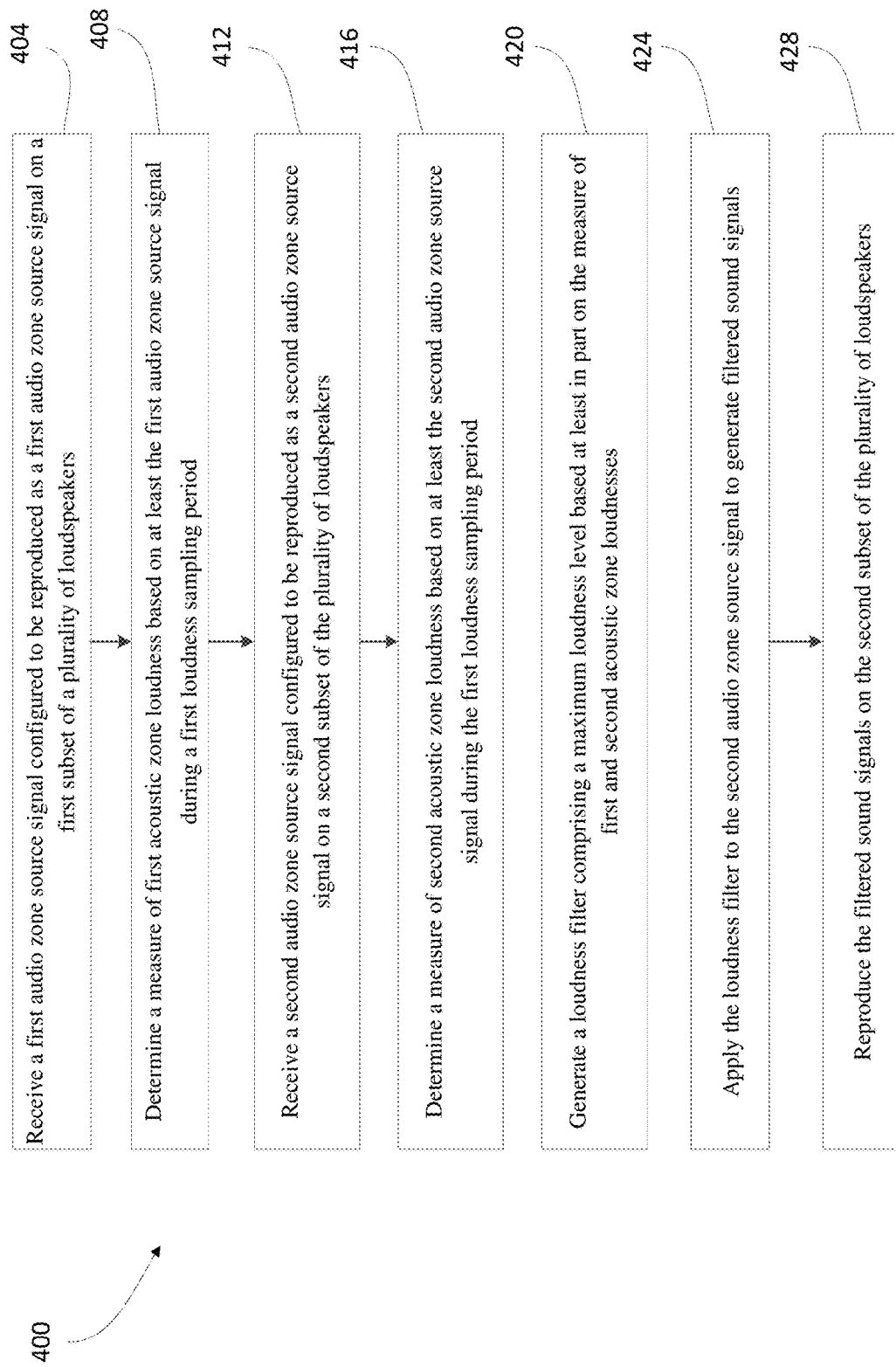
FIG. 4 shows another example method that may be performed by a multizone acoustic system, according to one embodiment.

FIG. 4 shows another example method 400 that may be performed by a multizone acoustic system, according to one embodiment. At box 404, the system receives a first acoustic zone source signal configured to be reproduced as a first acoustic zone source signal on a first subset of a plurality of loudspeakers. At box 408, the system determines a measure of first acoustic zone loudness based on at least the first acoustic zone source signal during a first loudness sampling period. At box 412, the system can receive a second acoustic zone source signal that is configured to be reproduced as a second acoustic zone source signal on a second subset of the plurality of loudspeakers. At box 416, the system determines a measure of second acoustic zone loudness based on at least the second acoustic zone source signal during the first loudness sampling period. At box 420, the system generates a loudness filter comprising a maximum loudness level based at least in part on the measure of first acoustic zone loudness and second acoustic zone loudness. At box 424, the system can apply the loudness filter to the second acoustic zone source signal to generate filtered sound signals. The system can reproduce the filtered sound signals on the second subset of the plurality of loudspeakers at box 428.

Figure 5:
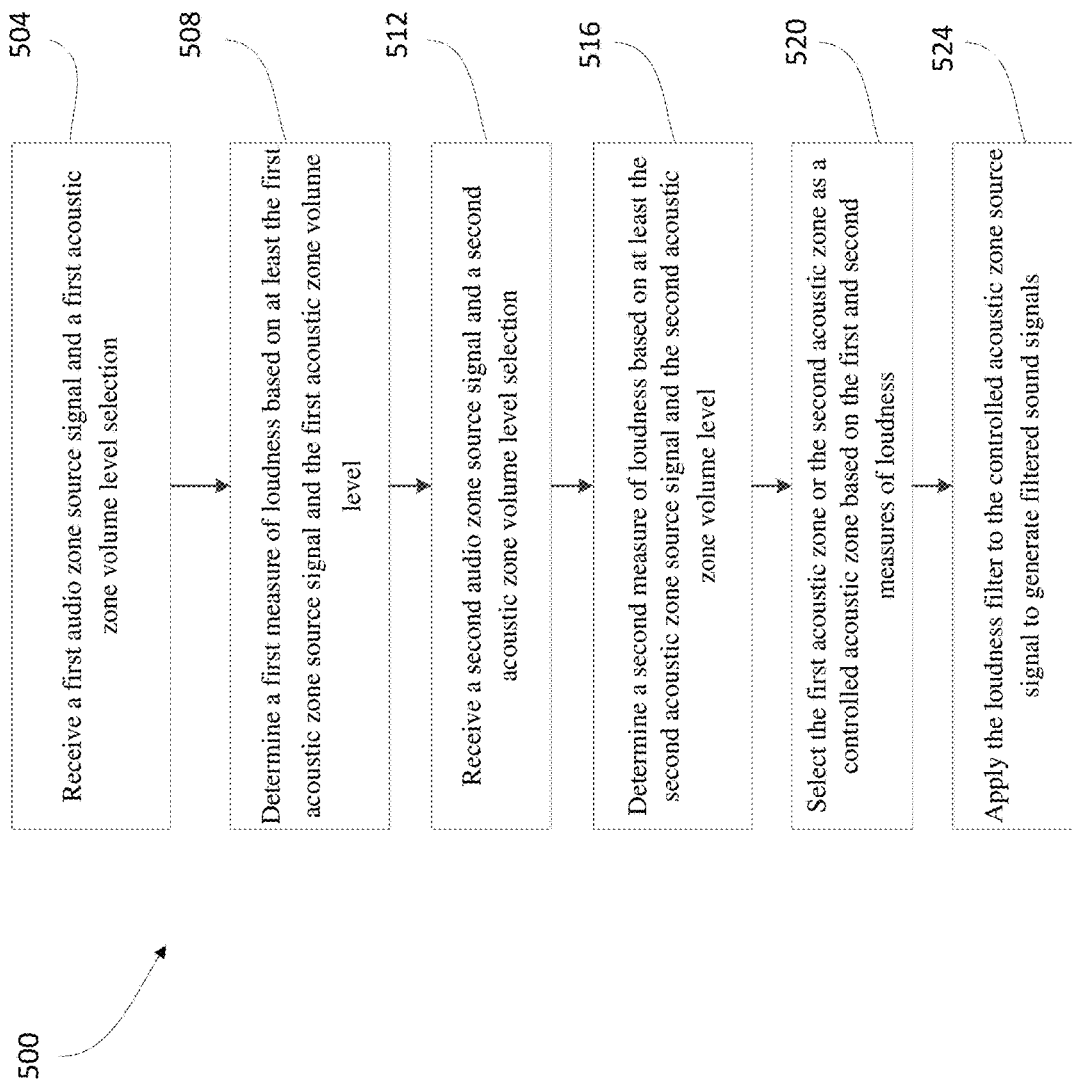
FIG. 5 shows another example method that may be performed by a multizone acoustic system, according to one embodiment.

FIG. 5 shows another example method 500 that may be performed by a multizone acoustic system, according to one embodiment. At box 504, the system receives a first audio zone source signal and a first acoustic zone volume level selection. At box 508, the system determines a first measure of loudness based on at least the first acoustic zone source signal and the first acoustic zone volume level. At box 512, the system can receive a second audio zone source signal and a second acoustic zone volume level selection. At box 516, the system determines a second measure of loudness based on at least the second acoustic zone source signal and the second acoustic zone volume level. At box 520, the system selects the first acoustic zone or the second acoustic zone as a controlled acoustic zone based on the first and second measures of loudness. In some embodiments, the selection of the first acoustic zone or second acoustic zone as the controlled acoustic zone may include selecting the first zone as the controlled zone by determining that the first acoustic signal is configured to reproduce on the first loudspeaker a louder sound than the second acoustic signal is configured to reproduce on the second loudspeaker. At box 524, the system can apply the loudness filter to the controlled acoustic zone source signal to generate filtered sound signals. The system can reproduce the filtered sound signals on a subset of loudspeakers associated with the controlled acoustic zone.

Example Embodiments

Some non-limiting example embodiments are provided below:

In a 1st example, an acoustic system comprises: an acoustic processor configured to analyze and output acoustic signals to each of the first and second loudspeakers corresponding to each of first and second acoustic zones of a shared acoustic space; and a non-transitory memory comprising instructions executable by the acoustic processor, wherein the instructions, when executed by the acoustic processor, cause the system to: determine a first measure of loudness associated with a first acoustic signal, wherein the acoustic processor is configured to output the first acoustic signal as sound on the first loudspeaker in the first acoustic zone; determine a second measure of loudness associated with a second acoustic signal, wherein the acoustic processor is configured to output the second acoustic signal as sound on the second loudspeaker in the second acoustic zone; and modify the second acoustic signal based on the first acoustic signal.

In a 2nd example, the acoustic system of Example 1, wherein the instructions, when executed by the acoustic processor, further cause the system to: receive the first acoustic signal; receive selection of a first acoustic zone volume level via a first volume level selection interface, the first acoustic zone volume level configured to modify a volume level within the first acoustic zone; and determine the first measure of loudness based on at least the first acoustic signal and the first acoustic zone volume level during a loudness sampling period.

In a 3rd example, the acoustic system of Example 2, wherein the loudness sampling period is between about 1 millisecond and about 2 seconds.

In a 4th example, the acoustic system of Example 2, wherein the instructions, when executed by the acoustic processor, further cause the system to: generate a loudness filter comprising a maximum loudness level based at least in part on the first measure of loudness.

In a 5th example, the acoustic system of Example 4, wherein the instructions, when executed by the acoustic processor, further cause the system to: receive a second acoustic signal; and receive selection of a second acoustic zone volume level via a second volume level selection interface.

In a 6th example, the acoustic system of Example 5, wherein the instructions, when executed by the acoustic processor, further cause the system to: determine the second measure of loudness based on at least the second acoustic signal and the second acoustic zone volume level during the loudness sampling period.

In a 7th example, the acoustic system of Example 6, wherein the maximum loudness level is further based on the second measure of loudness.

In an 8th example, the acoustic system of Example 7, wherein the maximum loudness level is further based on a difference between the second measure of loudness and the first measure of loudness.

In a 9th example, the acoustic system of Example 5, wherein the instructions, when executed by the acoustic processor, further cause the system to: modify the second acoustic signal based on the first acoustic signal by applying the loudness filter to the second acoustic signal to generate filtered sound signals, wherein a loudness level of the filtered sound signals is limited by at least one of the maximum loudness level and/or the second acoustic zone volume level selection.

In a 10th example, the acoustic system of Example 9, wherein the loudness level of the filtered sound signals is limited by the maximum loudness level.

In a 11th example, the acoustic system of Example 9, wherein the instructions, when executed by the acoustic processor, further cause the system to: output the filtered sound signals on the second loudspeaker.

In a 12th example, the acoustic system of Example 9, wherein the instructions, when executed by the acoustic processor, further cause the system to: determine that the first acoustic zone is associated with a spatial region of the shared acoustic space; and modify the second acoustic signal based further on the determination that the first acoustic zone is associated with the spatial region of the shared acoustic space.

In a 13th example, the acoustic system of Example 12, wherein the spatial region of the shared acoustic space corresponds to a driver of a vehicle.

In a 14th example, a computer-implemented method for filtering loudness of reproduced sound signals in at least one of a plurality of acoustic zones in a shared acoustic space, the method comprising: by an electronic processor of a system executing instructions stored on non-transitory memory connected to the electronic processor: receiving a first acoustic zone source signal configured to be reproduced as a first acoustic zone source signal on a first subset of a plurality of loudspeakers located in a first acoustic zone of the shared acoustic space; determining a measure of first acoustic zone loudness based on at least the first acoustic zone source signal during a first loudness sampling period; generating a loudness filter comprising a maximum loudness level based at least in part on the measure of first acoustic zone loudness; receiving a second acoustic zone source signal configured to be reproduced as a second acoustic zone source signal on a second subset of the plurality of loudspeakers located in a second acoustic zone of the shared acoustic space; applying the loudness filter to the second acoustic zone source signal to generate filtered sound signals, wherein a loudness level of the filtered sound signals is limited by the maximum loudness level; and reproducing the filtered sound signals on the second subset of the plurality of loudspeakers.

In a 15th example, the method of Example 14, further comprising: receiving selection of a first acoustic zone volume level via a first volume level selection interface.

In a 16th example, the method of Example 15, wherein determining the measure of first acoustic zone loudness is based further on the first acoustic zone volume level.

In a 17th example, the method of Example 14, further comprising: receiving selection of a second acoustic zone volume level via a second volume level selection interface.

In a 18th example, the method of Example 17, wherein determining the measure of second acoustic zone loudness is based further on the second acoustic zone volume level.

In a 19th example, the method of Example 14, wherein the first acoustic zone loudness associated with the first acoustic signal is determined at a regular sampling frequency.

In a 20th example, the method of Example 14, wherein the maximum loudness level comprises an average loudness level measured during the first loudness sampling period.

In a 21st example, the method of Example 14, wherein the first loudness sampling period is between about 1 microsecond and about 100 microseconds long.

In a 22nd example, a multizone acoustic system configured to filter loudness of reproduced sound signals in at least one of a plurality of acoustic zones in a shared acoustic space, the multizone acoustic system comprising: a multizone acoustic processor configured to couple to a plurality of loudspeakers; and a non-transitory memory comprising instructions executable by the multizone acoustic processor, wherein the instructions, when executed by the multizone acoustic processor, cause the multizone acoustic system to: receive a first acoustic zone source signal, wherein the multizone acoustic processor is configured to reproduce the first acoustic zone source signal on a first subset of the plurality of loudspeakers located in a first acoustic zone of the shared acoustic space; receive selection of a first acoustic zone volume level via a first volume level selection interface; determine a measure of first acoustic zone loudness based on at least the first acoustic zone source signal and the first acoustic zone volume level during a first loudness sampling period; generate a loudness filter comprising a maximum loudness level based on the measure of first acoustic zone loudness; receive a second acoustic zone source signal, wherein the multizone acoustic processor is configured to reproduce the second acoustic source signal on a second subset of the plurality of loudspeakers located in a second acoustic zone of the shared acoustic space; receive selection of a second acoustic zone volume level via a second volume level selection interface; apply the loudness filter to the second acoustic zone source signal to generate filtered sound signals, wherein a loudness level of the filtered sound signals is limited by the maximum loudness level and the second acoustic zone volume level; and reproduce the filtered sound signals on the second subset of the plurality of loudspeakers.

In a 23rd example, an acoustic system configured to modify a first acoustic signal corresponding to a first loudspeaker based on a determination that a first measure of loudness is greater than a second measure of loudness, the system comprising: an acoustic processor configured to generate an acoustic signal output to each of the first and second loudspeakers corresponding to each of first and second acoustic zones of a shared acoustic space; and a non-transitory memory comprising instructions executable by the acoustic processor, wherein the instructions, when executed by the acoustic processor, cause the system to: determine the first measure of loudness associated with the first acoustic signal, wherein the acoustic processor is configured to reproduce the first acoustic signal on the first loudspeaker; determine the second measure of loudness associated with a second acoustic signal, wherein the acoustic processor is configured to reproduce the second acoustic signal on the second loudspeaker; determine that the first measure of loudness is greater than the second measure of loudness; and based on the determination that the first measure of loudness is greater than the second measure of loudness, modify the first acoustic signal.

In a 24th example, the acoustic system of Example 23, wherein the instructions, when executed by the acoustic processor, cause the system to: receive the first acoustic signal; receive selection of a first acoustic zone volume level via a first volume level selection interface, the first acoustic zone volume level configured to modify a volume level within the first acoustic zone; and determine the first measure of loudness based on at least the first acoustic signal and the first acoustic zone volume level during a loudness sampling period.

In a 25th example, the acoustic system of Example 24, wherein the loudness sampling period is between about 1 millisecond and about 2 seconds.

In a 26th example, the acoustic system of Example 24, wherein the instructions, when executed by the acoustic processor, cause the system to: generate a loudness filter comprising a maximum loudness level based at least in part on the first measures of loudness.

In a 27th example, the acoustic system of Example 26, wherein the instructions, when executed by the acoustic processor, cause the system to: receive the second acoustic signal; and receive selection of a second acoustic zone volume level via a second volume level selection interface.

In a 28th example, the acoustic system of Example 27, wherein the instructions, when executed by the acoustic processor, cause the system to: determine the second measure of loudness based on at least the second acoustic signal and the second acoustic zone volume level during the loudness sampling period.

In a 29th example, the acoustic system of Example 28, wherein the maximum loudness level is based on the second measure of loudness.

In a 30th example, the acoustic system of Example 29, wherein the maximum loudness level is further based on a difference between the second measure of loudness and the first measure of loudness.

In a 31st example, the acoustic system of Example 27, wherein the instructions, when executed by the acoustic processor, cause the system to: modify the second acoustic signal based on the first acoustic signal by applying the loudness filter to the second acoustic signal to generate filtered sound signals, wherein a loudness level of the filtered sound signals is limited by at least one of: the maximum loudness level, the second acoustic zone volume level selection, and/or the first acoustic zone volume level selection.

In a 32nd example, the acoustic system of Example 31, wherein the loudness level of the filtered sound signals is limited by the maximum loudness level.

In a 33rd example, the acoustic system of Example 31, wherein the instructions, when executed by the acoustic processor, further cause the system to: output the filtered sound signals on the first and second loudspeakers.

In a 34th example, a multizone acoustic system configured to filter loudness of reproduced sound signals in at least one of a plurality of acoustic zones in a shared acoustic space, the multizone acoustic system comprising: a multizone acoustic processor configured to couple to a plurality of loudspeakers; and a non-transitory memory comprising instructions executable by the multizone acoustic processor, wherein the instructions, when executed by the multizone acoustic processor, cause the multizone acoustic system to: receive a first acoustic zone source signal, wherein the multizone acoustic processor is configured to reproduce the first acoustic zone source signal on a first subset of the plurality of loudspeakers located in a first acoustic zone of the shared acoustic space; receive a first acoustic zone volume level selection via a first volume level selection interface; receive a second acoustic zone source signal, wherein the multizone acoustic processor is configured to reproduce sound signals on a second subset of the plurality of loudspeakers located in a second acoustic zone of the shared acoustic space; receive a second acoustic zone volume level selection via a second volume level selection interface; determine a first measure of loudness based on at least the first acoustic zone source signal and the first acoustic zone volume level during a first loudness sampling period; determine a second measure of loudness based on at least the second acoustic zone source signal and the second acoustic zone volume level during the first loudness sampling period; select the first acoustic zone or the second acoustic zone as a controlled acoustic zone based on the first and second measures of loudness; generate a loudness filter comprising a maximum loudness level based on the first and second measures of loudness; apply the loudness filter to the controlled acoustic zone source signal to generate filtered sound signals, wherein a loudness level of the filtered sound signals is limited by the maximum loudness level and a volume level selection of the controlled acoustic zone; and reproduce the filtered sound signals in the controlled acoustic zone.

In a 35th example, the multizone acoustic system of Example 34, wherein selecting the first acoustic zone or the second acoustic zone as the controlled acoustic zone comprises determining that the first acoustic signal is configured to reproduce on the first loudspeaker a louder sound than the second acoustic signal is configured to reproduce on the second loudspeaker.

In a 36th example, the multizone acoustic system of Example 34, wherein the instructions, when executed by the acoustic processor, cause the system to: receive, via the corresponding first or second volume level selection interface, an increased volume level selection associated with the controlled zone, wherein the increased volume level selection is greater than the corresponding first or second acoustic zone volume level selection.

In a 37th example, the multizone acoustic system of Example 36, wherein the instructions, when executed by the acoustic processor, cause the system to: in response to receiving the increased volume level selection associated with the controlled zone, reduce a loudness level range of the filtered sound signals.

In a 38th example, the multizone acoustic system of Example 37, wherein reducing the loudness level range of the filtered sound signals comprises: capping a measure of loudness of louder portions of the filtered sound signals; and increasing the level of loudness of softer portions of the filtered sound signals.

In a 39th example, the multizone acoustic system of Example 37, wherein reducing the loudness level range of the filtered sound signals comprises: capping a measure of loudness of louder portions of the filtered sound signals; and capping the level of loudness of softer portions of the filtered sound signals.

In a 40th example, the multizone acoustic system of Example 34, wherein the instructions, when executed by the acoustic processor, further cause the system to: determine the first measure of loudness at a regular sampling frequency.

In a 41st example, the multizone acoustic system of Example 34, wherein the maximum loudness level comprises an average loudness level measured during the first loudness sampling period.

In a 42nd example, the multizone acoustic system of Example 34, wherein the first loudness sampling period is between about 1 microsecond and about 100 microseconds long.

In a 43rd example, a dynamic loudness control system configured to filter loudness of reproduced sound signals in a first acoustic zone in a shared acoustic space, the dynamic loudness control system comprising: a dynamic loudness control processor configured to couple to a plurality of loudspeakers; and a non-transitory memory comprising instructions executable by the dynamic loudness control processor, wherein the instructions, when executed by the dynamic loudness control processor, cause the dynamic loudness control system to: receive a first acoustic zone source signal, wherein the dynamic loudness control processor is configured to reproduce the first acoustic zone source signal on a first subset of the plurality of loudspeakers located in the first acoustic zone of the shared acoustic space; receive a first acoustic zone volume level selection via a first volume level selection interface; receive a second acoustic zone source signal, wherein the dynamic loudness control processor is configured to reproduce sound signals on a second subset of the plurality of loudspeakers located in a second acoustic zone of the shared acoustic space; receive a second acoustic zone volume level selection via a second volume level selection interface; determine a first measure of loudness based on at least the first acoustic zone source signal and the first acoustic zone volume level during a first loudness sampling period; determine a second measure of loudness based on at least the second acoustic zone source signal and the second acoustic zone volume level during the first loudness sampling period; determine that the first measure of loudness is greater than the second measure of loudness; generate, based on the determination that that the first measure of loudness is greater than the second measure of loudness, a loudness filter comprising a maximum loudness level; apply the loudness filter to the first acoustic zone source signal to generate filtered sound signals, wherein a loudness level of the filtered sound signals is limited by the maximum loudness level and the first acoustic zone volume level selection; and reproduce the filtered sound signals in the first acoustic zone.

In a 44th example, the control system of Example 43, wherein the loudness level of the filtered sound signals is limited by the maximum loudness level.

In a 45th example, the control system of Example 43, wherein the instructions, when executed by the acoustic processor, cause the system to: receive, via the first volume level selection interface, an increased volume level selection associated with the first zone, wherein the increased volume level selection is greater than the first acoustic zone volume level selection.

In a 46th example, the control system of Example 45, wherein the instructions, when executed by the acoustic processor, cause the system to: in response to receiving the increased volume level selection associated with the first zone, reduce a loudness level range of the filtered sound signals.

In a 47th example, the control system of Example 46, wherein reducing the loudness level range of the filtered sound signals comprises: capping a measure of loudness of louder portions of the filtered sound signals; and increasing the level of loudness of softer portions of the filtered sound signals.

In a 48th example, the control system of Example 46, wherein reducing the loudness level range of the filtered sound signals comprises: capping a measure of loudness of louder portions of the filtered sound signals; and capping the level of loudness of softer portions of the filtered sound signals.

In a 49th example, the control system of Example 43, wherein the instructions, when executed by the acoustic processor, further cause the system to: determine the first measure of loudness at a regular sampling frequency.

In a 50th example, the control system of Example 43, wherein the maximum loudness level comprises an average loudness level measured during the first loudness sampling period.

In a 51st example, the control system of Example 43, wherein the first loudness sampling period is between about 1 microsecond and about 100 microseconds long.

CONCLUSION

Reference throughout this specification to "some embodiments" or "an embodiment" means that a particular feature, structure, or characteristic described in connection with the embodiment is included in at least some embodiments. Thus, appearances of the phrases "in some embodiments" or "in an embodiment" in various places throughout this specification are not necessarily all referring to the same embodiment and may refer to one or more of the same or different embodiments. Furthermore, the particular features, structures or characteristics may be combined in any suitable manner, as would be apparent to one of ordinary skill in the art from this disclosure, in one or more embodiments.

As used in this application, the terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Similarly, it should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Rather, inventive aspects lie in a combination of fewer than all features of any single foregoing disclosed embodiment. Accordingly, no feature or group of features is necessary or indispensable to each embodiment.

A number of applications, publications, and external documents may be incorporated by reference herein. Any conflict or contradiction between a statement in the body text of this specification and a statement in any of the incorporated documents is to be resolved in favor of the statement in the body text.

Although described in the illustrative context of certain preferred embodiments and examples, it will be understood by those skilled in the art that the disclosure extends beyond the specifically described embodiments to other alternative embodiments and/or uses and obvious modifications and equivalents. Thus, it is intended that the scope of the claims which follow should not be limited by the particular embodiments described above.

What is claimed is:

1. An acoustic system configured to modify a first acoustic signal corresponding to a first loudspeaker based on a determination that a first measure of loudness is greater than a second measure of loudness, the system comprising:
    an acoustic processor configured to generate an acoustic signal output to each of the first loudspeaker and a second loudspeaker corresponding to each of first and second acoustic zones of a shared acoustic space; and
    a non-transitory memory comprising instructions executable by the acoustic processor, wherein the instructions, when executed by the acoustic processor, cause the system to:
    receive the first acoustic signal;
    receive selection of a first acoustic zone volume level via a first volume level selection interface, the first acoustic zone volume level configured to modify a volume level within the first acoustic zone;
    determine, based on at least the first acoustic signal and the first acoustic zone volume level during a loudness sampling period, the first measure of loudness associated with the first acoustic signal, wherein the acoustic processor is configured to reproduce the first acoustic signal on the first loudspeaker;
    determine the second measure of loudness associated with a second acoustic signal, wherein the acoustic processor is configured to reproduce the second acoustic signal on the second loudspeaker;
    determine that the first measure of loudness is greater than the second measure of loudness; and
    based on the determination that the first measure of loudness is greater than the second measure of loudness, modify the first acoustic signal.

2. The acoustic system of claim 1, wherein the loudness sampling period is between about 1 millisecond and about 2 seconds.

3. The acoustic system of claim 1, wherein the instructions, when executed by the acoustic processor, cause the system to:
    generate a loudness filter comprising a maximum loudness level based at least in part on the first measures of loudness.

4. The acoustic system of claim 3, wherein the instructions, when executed by the acoustic processor, cause the system to:
    receive the second acoustic signal; and
    receive selection of a second acoustic zone volume level via a second volume level selection interface.

5. The acoustic system of claim 4, wherein the instructions, when executed by the acoustic processor, cause the system to:
    determine the second measure of loudness based on at least the second acoustic signal and the second acoustic zone volume level during the loudness sampling period.

6. The acoustic system of claim 5, wherein the maximum loudness level is based on the second measure of loudness.

7. The acoustic system of claim 4, wherein the instructions, when executed by the acoustic processor, cause the system to:
    modify the second acoustic signal based on the first acoustic signal by applying the loudness filter to the second acoustic signal to generate filtered sound signals, wherein a loudness level of the filtered sound signals is limited by at least one of: the maximum loudness level, the second acoustic zone volume level selection, and/or the first acoustic zone volume level selection.

8. The acoustic system of claim 7, wherein the loudness level of the filtered sound signals is limited by the maximum loudness level.

9. A multizone acoustic system configured to filter loudness of reproduced sound signals in at least one of a plurality of acoustic zones in a shared acoustic space, the multizone acoustic system comprising:

a multizone acoustic processor configured to couple to a plurality of loudspeakers; and a non-transitory memory comprising instructions executable by the multizone acoustic processor, wherein the instructions, when executed by the multizone acoustic processor, cause the multizone acoustic system to:

receive a first acoustic zone source signal, wherein the multizone acoustic processor is configured to reproduce the first acoustic zone source signal on a first subset of the plurality of loudspeakers located in a first acoustic zone of the shared acoustic space;

receive a first acoustic zone volume level selection via a first volume level selection interface;

receive a second acoustic zone source signal, wherein the multizone acoustic processor is configured to reproduce sound signals on a second subset of the plurality of loudspeakers located in a second acoustic zone of the shared acoustic space;

receive a second acoustic zone volume level selection via a second volume level selection interface;

determine a first measure of loudness based on at least the first acoustic zone source signal and the first acoustic zone volume level during a first loudness sampling period;

determine a second measure of loudness based on at least the second acoustic zone source signal and the second acoustic zone volume level during the first loudness sampling period;

select the first acoustic zone or the second acoustic zone as a controlled acoustic zone based on the first and second measures of loudness;

generate a loudness filter comprising a maximum loudness level based on the first and second measures of loudness;

apply the loudness filter to the controlled acoustic zone source signal to generate filtered sound signals, wherein a loudness level of the filtered sound signals is limited by the maximum loudness level and a volume level selection of the controlled acoustic zone; and reproduce the filtered sound signals in the controlled acoustic zone.

10. The multizone acoustic system of claim 9, wherein selecting the first acoustic zone or the second acoustic zone as the controlled acoustic zone comprises determining that the first acoustic signal is configured to reproduce on the first loudspeaker a louder sound than the second acoustic signal is configured to reproduce on the second loudspeaker.

11. The multizone acoustic system of claim 9, wherein the instructions, when executed by the acoustic processor, cause the system to:

receive, via the corresponding first or second volume level selection interface, an increased volume level selection associated with the controlled zone, wherein the increased volume level selection is greater than the corresponding first or second acoustic zone volume level selection.

12. The multizone acoustic system of claim 11, wherein the instructions, when executed by the acoustic processor, cause the system to:

in response to receiving the increased volume level selection associated with the controlled zone, reduce a loudness level range of the filtered sound signals.

13. The multizone acoustic system of claim 12, wherein reducing the loudness level range of the filtered sound signals comprises:

capping a measure of loudness of louder portions of the filtered sound signals; and increasing the level of loudness of softer portions of the filtered sound signals.

14. The multizone acoustic system of claim 12, wherein reducing the loudness level range of the filtered sound signals comprises:

capping a measure of loudness of louder portions of the filtered sound signals; and capping the level of loudness of softer portions of the filtered sound signals.

15. The multizone acoustic system of claim 9, wherein the instructions, when executed by the acoustic processor, further cause the system to:

determine the first measure of loudness at a regular sampling frequency.

16. The multizone acoustic system of claim 9, wherein the maximum loudness level comprises an average loudness level measured during the first loudness sampling period.

17. The multizone acoustic system of claim 9, wherein the first loudness sampling period is between about 1 microsecond and about 100 microseconds long.

18. A dynamic loudness control system configured to filter loudness of reproduced sound signals in a first acoustic zone in a shared acoustic space, the dynamic loudness control system comprising:

a dynamic loudness control processor configured to couple to a plurality of loudspeakers; and a non-transitory memory comprising instructions executable by the dynamic loudness control processor, wherein the instructions, when executed by the dynamic loudness control processor, cause the dynamic loudness control system to:

receive a first acoustic zone source signal, wherein the dynamic loudness control processor is configured to reproduce the first acoustic zone source signal on a first subset of the plurality of loudspeakers located in the first acoustic zone of the shared acoustic space;

receive a first acoustic zone volume level selection via a first volume level selection interface;

receive a second acoustic zone source signal, wherein the dynamic loudness control processor is configured to reproduce sound signals on a second subset of the plurality of loudspeakers located in a second acoustic zone of the shared acoustic space;

receive a second acoustic zone volume level selection via a second volume level selection interface;

determine a first measure of loudness based on at least the first acoustic zone source signal and the first acoustic zone volume level during a first loudness sampling period;

determine a second measure of loudness based on at least the second acoustic zone source signal and the second acoustic zone volume level during the first loudness sampling period;

determine that the first measure of loudness is greater than the second measure of loudness;

generate, based on the determination that that the first measure of loudness is greater than the second measure of loudness, a loudness filter comprising a maximum loudness level;

apply the loudness filter to the first acoustic zone source signal to generate filtered sound signals, wherein a loudness level of the filtered sound signals is limited by the maximum loudness level and the first acoustic zone volume level selection; and reproduce the filtered sound signals in the first acoustic zone.

19. The control system of claim 18, wherein the instructions, when executed by the acoustic processor, cause the system to:
receive, via the first volume level selection interface, an increased volume level selection associated with the first zone, wherein the increased volume level selection is greater than the first acoustic zone volume level selection.

* * * * *